(12) United States Patent
Zhang et al.

(10) Patent No.: US 7,476,115 B2
(45) Date of Patent: Jan. 13, 2009

(54) LAND GRID ARRAY CONNECTOR WITH RETAING CLIP

(75) Inventors: Jie-Feng Zhang, ShenZhen (CN); Wen He, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/985,293

(22) Filed: Nov. 13, 2007

(65) Prior Publication Data

US 2008/0113545 A1    May 15, 2008

(30) Foreign Application Priority Data

Nov. 13, 2006    (CN) .......................... 2006 20125279

(51) Int. Cl.
*H01R 13/62* (2006.01)
(52) U.S. Cl. ......................................... 439/331; 439/73
(58) Field of Classification Search .................. 439/70, 439/73, 157, 259, 331, 342, 345
See application file for complete search history.

(56) References Cited

U.S. PATENT DOCUMENTS

| | | | |
|---|---|---|---|
| 6,485,320 B1* | 11/2002 | Ma | 439/342 |
| 6,699,057 B2* | 3/2004 | Ma | 439/342 |
| 6,722,909 B1* | 4/2004 | McHugh et al. | 439/331 |
| 6,799,978 B2* | 10/2004 | Ma et al. | 439/73 |
| 6,974,345 B2 | 12/2005 | Yang et al. | |
| 2008/0113545 A1* | 5/2008 | Zhang et al. | 439/345 |
| 2008/0160814 A1* | 7/2008 | Howell | 439/331 |
| 2008/0214025 A1* | 9/2008 | Zhang et al. | 439/65 |

\* cited by examiner

*Primary Examiner*—James Harvey
(74) *Attorney, Agent, or Firm*—Wei Te Chung

(57) ABSTRACT

A land grid array connector (100) has a stiffener defining a window (305) thereon, a metal clip (40) pivotably coupling with stiffener, a lever (50) engaging on the stiffener, a housing (10) received in the window of the stiffener and a number of contacts mounted to the housing. The lever includes a pair of locating portions (501) and an offset actuating portion (503) disposed between the locating portions. The clip includes a projecting portion (400) having a depress portion (405) for receiving the offset actuating portion of the lever, a protruding portion (406) bending upwardly and inwardly from an end of the depress portion and a pair of guiding portions (4060) extending outwardly from the protruding portion for resisting against opposite ends of the offset actuating portion.

15 Claims, 3 Drawing Sheets

LAND GRID ARRAY CONNECTOR WITH RETAING CLIP

BACKGROUND OF THE INVENTION

1. Field of the Invention

The present invention is directed to an art of a land grid array (LGA) connector for electrically bridging two electrical interfaces such as a printed circuit board (PCB) and a central processing unit (CPU).

2. Description of Prior Arts

U.S. Pat. No. 6,974,345 issued on Dec. 13, 2005 discloses a LGA connector for electrically connecting a Land Grid Package (LGP) to a printed circuit board (PCB). The LGA connector includes a housing having a supporting portion for supporting the LGP and a mounting portion, a number of terminals secured on the housing, a stiffener defining a middle window for receiving the mounting portion of the housing, a clip having a pair of securing portions pivotably engaged with corresponding cavities defined on one end of the stiffener, and a lever coupled with another end of the stiffener for fastening the clip onto the housing. The stiffener has a pair of side walls, a front wall defining a recess portion for engaging with the lever and a rear wall having a pair of chambers. The clip further has a projecting portion which is of trapezoidal configuration and extends outwardly from an end of the clip. The projecting portion comprises a depress portion, a rib interfered with the lever. The clip includes a tail portion extending from the rib of the projecting portion. The lever includes a pair of locating portion pivotably received in the chambers of the stiffener, an offset actuating portion disposed between the locating portions and received in the depress portion for pressing the clip, and an operating portion extending perpendicularly from an end of the locating portion. The configuration of offset actuating portion is similar to the trapezoidal configuration of the projecting portion of the clip. That is, the end of the projecting portion of the clip resists against the corresponding end of the offset actuating portion.

In use, the clip is rotated to a horizontal close position and the projecting portion is received in the recess portion of the front wall of the stiffener. The lever is finally locked by a latch extending from a side wall of the stiffener. The offset actuating portion of the lever is received in the depress portion of the clip and resists against the rib of the projecting portion of the clip for firmly engaging with the clip. It is noted that the above mentioned performance requires the projecting portion of the clip have precise position for engaging with the offset actuating portion of the lever. Frequently, the position of the projecting portion is too lower to firmly resist against the offset actuating portion. That is, the engagement between the stiffener and clip is unreliable.

Hence, it is desirable to provide an improved land grid array connector to overcome the aforementioned disadvantages.

SUMMARY OF THE INVENTION

An object of the present invention is to provide an LGA connector comprising a clip having a projecting portion that can firmly retain a lever.

To achieve the above object, A land grid array connector comprises a stiffener defining a window thereon and having a front wall, a pair of side plates and a rear wall, a metal clip pivotably engaged rear wall of stiffener, a lever engaging on the stiffener, a housing received in the window of the stiffener, a plurality of contacts mounted to the housing. The lever comprises a pair of locating portions, an offset actuating portion disposed between the locating portions and a locking portion coupling with a latch disposed on one side plate of stiffener. The clip includes a projecting portion having a depress portion for receiving the offset actuating portion of the lever, a protruding portion bending upwardly and inwardly from an end of the depress portion and a pair of guiding portions extending outwardly from the protruding portion for resisting against opposite ends of the offset actuating portion.

Advantages of the present invention are to provide a clip having a projecting portion. The projecting portion has a depress portion and a protruding portion to form an arced room for receiving the offset actuating portion of lever. When the clip is rotated downwardly to a horizontal closed position, the offset actuating portion is rotating in the arced room and the guiding portions resist against the opposite ends of the offset actuating portion. That is, the lever is firmly retained by the projecting portion of the clip.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
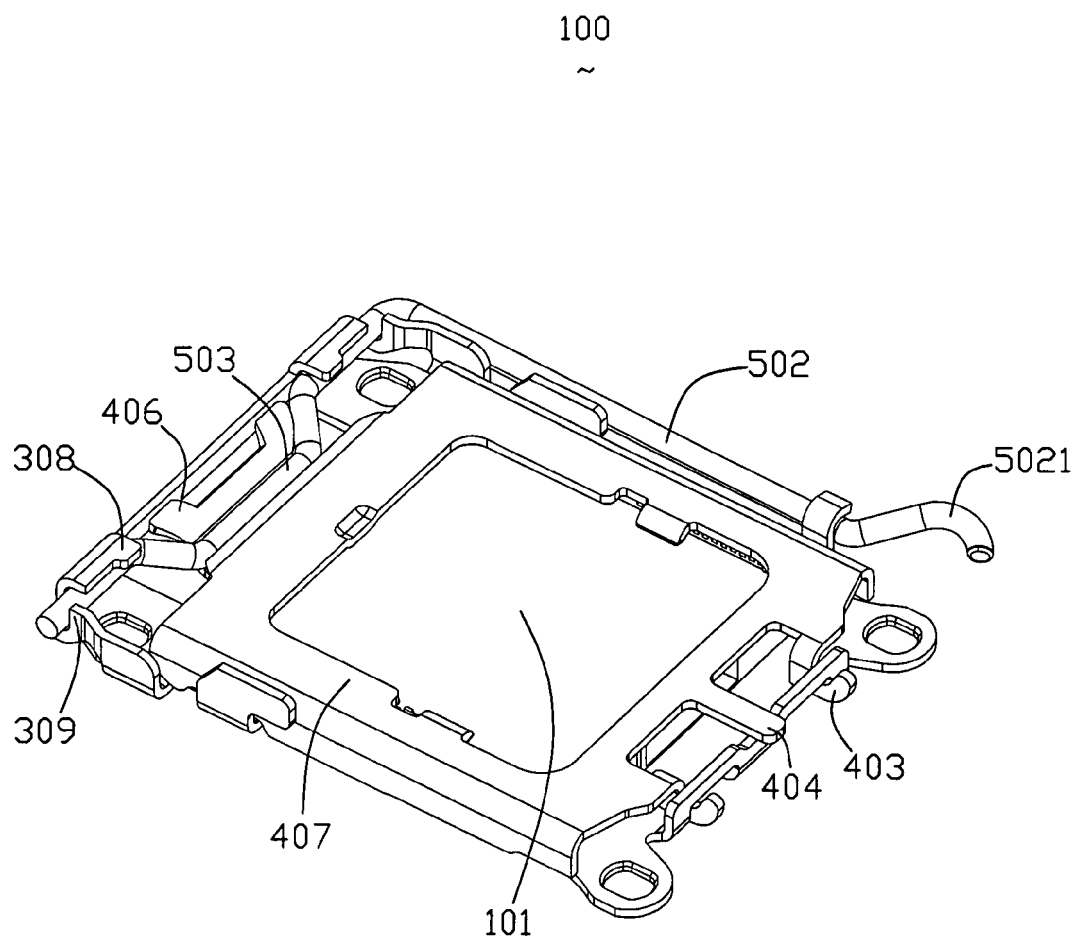
FIG. 1 is an assembled perspective view of a land grid array connector to the present invention.
Figure 2:
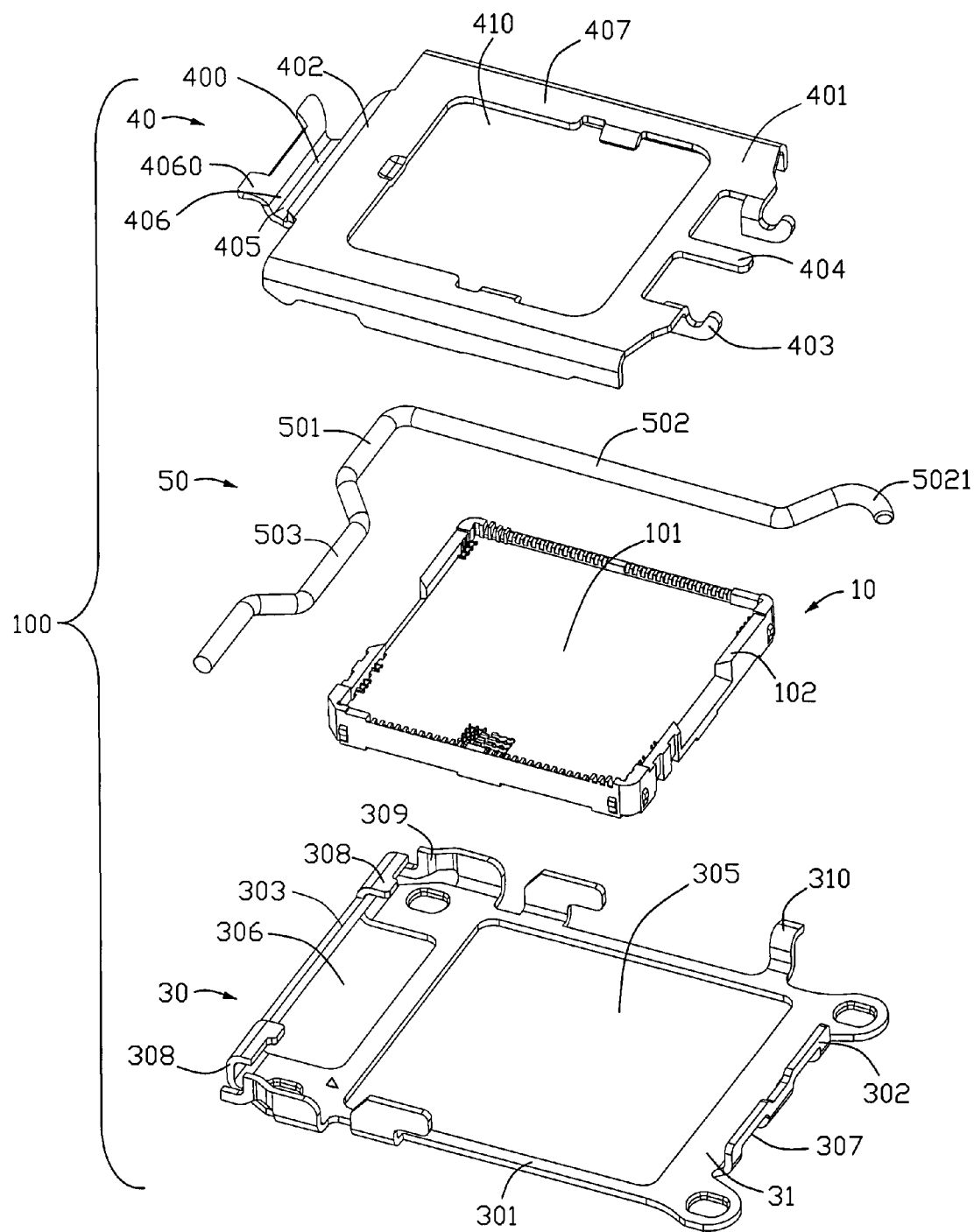
FIG. 2 is an exploded view of the land grid array connector as shown in FIG. 1.
Figure 3:
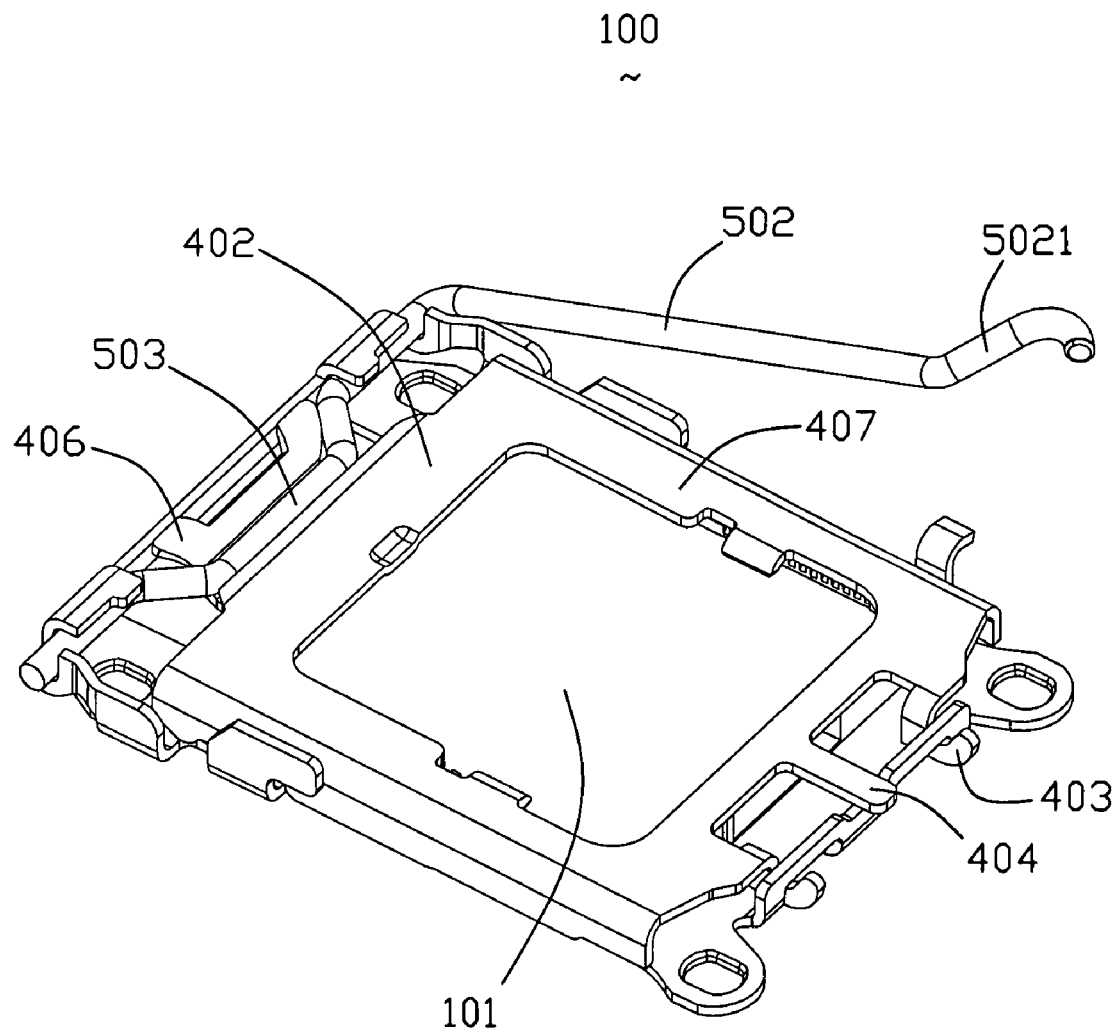
FIG. 3 is a assembly view of the land grid array connector when a lever is rotated downwardly to a horizontal closed position.

Reference will now be made to the drawing figures to describe the present invention in detail. Referring to FIGS. 1-3, a land grid array connector 100 in accordance with the embodiment of the present invention comprises a housing 10 mounted on a printed circuit board (not shown), a stiffener 30 having a front wall 303, a pair of side plates 301 and a rear wall 302, a metal clip 40 pivotably engaged rear wall 302 of stiffener 30, and a lever 50 engaged on the side plates of the stiffener 30 for fastening the clip 40 onto the housing 10. A Land Grid Package (LGP) (not shown) is ready to be disposed between the housing 10 and the clip 40, for connecting with the printed circuit board via the connector 100.

The housing 10 is of rectangular configuration. A plurality of passageways (not labeled) is defined in the housing 10 for receiving a corresponding number of electrical contacts (not labeled) therein. The housing 10 comprises a supporting portion 101 and a mounting portion 102 integrally connecting with the supporting portion 101.

The stiffener 30 comprises a bottom wall 31 and a window 305 defined in a middle portion of the bottom wall 31 for receiving the mounting portion 102 of the housing 2. The front wall 303 of the stiffener 30 is of U-shaped configuration and has a pair of chambers 308 for coupling with the lever 50. The rear wall 302 defines a pair of pivotal holes 307 for coupling with the metal clip 40. The stiffener 30 further has a latch 310 extending outside from a side wall 301 for engaging with a locking portion 5021 disposed on the lever 50.

The lever 50 comprises a pair of locating portions 501 engaging with corresponding chamber 308 of stiffener 30, an offset actuating portion 503 disposed between the locating portions 501 and an operating portion 502 extending perpendicularly from an end of the locating portion 501. The locking portion 5021 extends from the operating portion 502 for coupling with the latch 310 of stiffener 30.

The clip 40 comprises a front plate 402, a rear plate 401, a pair of side plates 407 and a cavity 410 defined therebetween. The clip 40 further includes a pair of hooks 403 extending rearwardly from the rear plate 401 for pivotably mounting in the holes 307 of the rear wall 302 of the stiffener 30 and a tail 404 located between the hooks 403. When the clip 40 is oriented at a position perpendicular to the housing 10, the tail 404 abuts against the stiffener 30 to prevent the clip 40 from being over-rotated. The clip further has a projecting portion 400 extending from the front plate 402 and received in a gap 306 defined on the bottom wall 31 of the stiffener 30. The projecting portion 400 has a depress portion 405 for receiving the offset actuating portion 503 of the lever 50, a protruding portion 406 bending upwardly and inwardly from an end of the depress portion 405 and a pair of guiding portion 4060 extending outwardly from the protruding portion 406 for resisting against opposite ends of the offset actuating portion 503. When the clip 40 is rotated downwardly to a horizontal closed position, the offset actuating portion 503 is rotating in the depress portion 405 and the guiding portions 4060 resist against the opposite ends of the offset actuating portion 503. That is, the lever 50 is firmly retained by the projecting portion 400 of the clip 40.

In use of the connector 1, the LGP is disposed onto the housing 10. The clip 40 is mounted to the stiffener 30 and the pair of locating portion 501 are received in corresponding chamber 308 disposed on the front wall 303 of the stiffener 30. The clip 40 is then rotated downwardly to a horizontal closed position. The offset actuation portion 503 of the lever 50 is actuated to press the depress portion 405 of the projecting portion 400 of the clip 40 and the ends of the guiding portion 4060 resist against the opposite ends of the offset actuating portion 503. That is, the lever 50 is firmly retained by the projecting portion 400 of the clip 40.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A land grid array connector for connecting a land grid package to a printed circuit board, comprising:
   a stiffener comprising a bottom wall defining a window, a front wall, a pair of side walls, and a rear wall;
   a housing comprising a supporting portion and a mounting portion received in the window of the stiffener;
   a plurality of contacts mounted to the supporting portion of the housing;
   a lever comprising a pair of locating portions engaging with the stiffener and an offset actuating portion disposed between the locating portions;
   a clip having a plurality of hooks for pivotably engaging with the rear wall of the stiffener and a projecting portion extending forwardly therefrom;
   wherein the projecting portion has a depress portion receiving the offset actuating portion of the lever and a protruding portion bending upwardly and inwardly from an end of the depress portion and a pair of guiding portions extending outwardly from the protruding portion for resisting against opposite ends of the offset actuating portion.

2. The land grid array connector as claimed in claim 1, wherein said lever comprises an operating portion extending perpendicularly from an end of the locating portion and a locking portion bending from the operating portion.

3. The land grid array connector as claimed in claim 2, wherein said stiffener comprises a latch extending outside from the side wall for engaging with the locking portion of the lever.

4. The land grid array connector as claimed in claim 1, wherein said rear wall of the stiffener has a pair of holes for coupling with the hooks of the clip.

5. The land grid array connector as claimed in claim 1, wherein said front wall of the stiffener is of U-shaped configuration and has a pair of chambers for coupling with the locating portions of the lever.

6. The land grid array connector as claimed in claim 1, wherein said clip comprises a pair of clasping portions bending inwardly for pressing the land grid package.

7. The land grid array connector as claimed in claim 1, wherein said clip comprises a tail located between the hooks and engaging with the rear wall for preventing the clip from being over-rotated.

8. An electrical connector assembly comprising:
   a stiffener comprising a bottom wall defining a window, and opposite first and second walls at two opposite ends of the bottom wall;
   an insulative housing received in the window;
   a plurality of contacts disposed in the housing;
   a lever pivotally mounted on the first wall and comprising an offset actuating portion; and
   a clip pivotally mounted on the second wall and comprising a projecting portion; wherein
   the projecting portion has a depress portion receiving the offset actuating portion of the lever when the lever locks the clip so as to assure no upward movement of the clip, and a protruding portion with a pair of engagement sections at two opposite ends thereof to abut against the opposite ends of the offset actuating portion so as to prevent transverse relative movement between the clip and the lever.

9. The connector assembly as claimed in claim 8, wherein said pair of engagement sections are essentially the guiding portions to guide the offset actuating portion to enter the depressing portion.

10. The connector assembly as claimed in claim 8, wherein said housing and said stiffener are intimately engaged with each other.

11. The connector assembly as claimed in claim 8, wherein a shape of the protruding portion is compliant, in a top view, with that of the offset actuating portion.

12. An electrical connector assembly comprising:
   an insulative housing;
   a plurality of contacts disposed in the housing;
   a metallic stiffener comprising opposite first and second walls around two opposite ends of the housing;
   a lever pivotally mounted on the first wall and comprising an offset actuating portion; and
   a clip pivotally mounted on the second wall and comprising a projecting portion; wherein
   the projecting portion has a depress portion receiving the offset actuating portion of the lever when the lever locks the clip so as to assure no upward movement of the clip, and a protruding portion with a pair of engagement sections at two opposite ends thereof to abut against the opposite ends of the offset actuating portion so as to prevent transverse relative movement between the clip and the lever.

13. The connector assembly as claimed in claim 12, wherein said pair of engagement sections are essentially the guiding portions to guide the offset actuating portion to enter the depressing portion.

14. The connector assembly as claimed in claim 12, wherein said housing and said stiffener are intimately engaged with each other.

15. The connector assembly as claimed in claim 12, wherein a shape of the protruding portion is compliant, in a top view, with that of the offset actuating portion.

* * * * *